United States Patent [19]
Wilson et al.

[11] Patent Number: 5,933,750
[45] Date of Patent: Aug. 3, 1999

[54] METHOD OF FABRICATING A SEMICONDUCTOR DEVICE WITH A THINNED SUBSTRATE

[75] Inventors: Syd R. Wilson, Phoenix; Charles E. Weitzel, Mesa; Mohit Bhatnagar, Chandler; Karen E. Moore, Phoenix; Thomas A. Wetteroth, Chandler, all of Ariz.

[73] Assignee: Motorola, Inc., Schaumburg, Ill.

[21] Appl. No.: 09/054,561

[22] Filed: Apr. 3, 1998

[51] Int. Cl.$^6$ ................................................. H01L 21/58
[52] U.S. Cl. ........................... 438/455; 438/459; 438/977
[58] Field of Search ................... 438/459, 455, 438/977

[56] References Cited

U.S. PATENT DOCUMENTS

| | | | |
|---|---|---|---|
| 4,601,779 | 7/1986 | Abernathey et al. | 438/459 |
| 4,983,251 | 1/1991 | Haisma et al. | 438/459 |
| 5,229,305 | 7/1993 | Baker | 438/459 |
| 5,256,581 | 10/1993 | Foerstner et al. | 438/459 |
| 5,294,814 | 3/1994 | Das | 257/77 |
| 5,374,564 | 12/1994 | Bruel | 438/455 |
| 5,449,930 | 9/1995 | Zhou | 257/197 |
| 5,494,835 | 2/1996 | Bruel | 156/250 |
| 5,661,333 | 8/1997 | Bruel et al. | 257/618 |
| 5,728,624 | 3/1998 | Linn et al. | 438/459 |
| 5,801,073 | 9/1998 | Robbins et al. | 438/125 |
| 5,804,086 | 9/1998 | Bruel | 216/33 |
| 5,863,830 | 1/1999 | Bruel et al. | 438/478 |

*Primary Examiner*—Peter Toby Brown
*Assistant Examiner*—Maria Guerrero
*Attorney, Agent, or Firm*—Robert F. Hightower

[57] ABSTRACT

A method of fabricating a semiconductor device on thinned wide bandgap material including providing a support having a planar surface and a semiconductor substrate. Implanting a layer of ions in the substrate to create a layer of microbubbles defining a thin film having a planar surface and a remaining mass separated by the layer of implanted ions. Intimately contacting the planar surface of the thin film to the planar surface of the support and heating the support and substrate to separate the remaining mass from the thin film. A semiconductor device is formed on the thin film, and the support is thinned.

16 Claims, 2 Drawing Sheets

METHOD OF FABRICATING A SEMICONDUCTOR DEVICE WITH A THINNED SUBSTRATE

FIELD OF THE INVENTION

This invention relates to semiconductors, and more particularly to a method of fabricating semiconductor devices.

BACKGROUND OF THE INVENTION

Presently, some semiconductor device, such as RF power transistors, function more efficiently with lowered thermal resistance of the substrate material. The thermal resistance can be lowered in a number of ways to increase device performance. The common method of lowering thermal resistance is wafer or substrate thinning. This is typically accomplished by dry or wet chemical etching or backlapping/polishing techniques. There are a number of difficulties with this approach. The materials used for the substrate in RF transistors are typically P+ Buffer on N-substrate, semi-insulating substrates or high resistivity substrates. Each of these substrates is relatively expensive and mostly discarded through the thinning process. The use of other materials, such as silicon carbide, are contemplated. While many of these materials provide good thermal conductance, they are extremely difficult to thin and very expensive.

It would be highly advantageous, therefore, to remedy the foregoing and other deficiencies inherent in the prior art.

Accordingly, it is an object of the present invention to provide a new and improved method of fabricating a semiconductor device on a thinned substrate.

Another object of the invention is to provide a method of increasing thermal conductivity of a semiconductor device.

And another object of the invention is to provide a new and improved method of fabricating a semiconductor device on a thinned substrate which allows recycling of the substrate.

Still another object of the present invention is to provide a new and improved method of fabricating a semiconductor device on an inexpensive thinned substrate which does not require conventional thinning of expensive substrates thereby reducing costs.

SUMMARY OF THE INVENTION

Briefly, to achieve the desired objects of the instant invention in accordance with a preferred embodiment thereof, provided is a method of fabricating a semiconductor device on thinned wide bandgap material. The method includes the steps of providing a support having a planar surface and a semiconductor substrate. A layer of ions is implanted in the substrate to create a layer of microbubbles defining a thin film having a planar surface and a remaining mass separated by the layer of implanted ions. The planar surface of the thin film is intimately contacted to the planar surface of the support. Heating the substrate and the support separates the remaining mass from the thin film. A semiconductor device is formed on the thin film, and the support is thinned.

In a specific embodiment, further provided is the step of forming a metal layer on the planar surface of the substrate and bonding the metal layer to the planar surface of the support. Thinning the support includes etching the support utilizing the metal layer as an etch stop.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENTS

Figure 1:
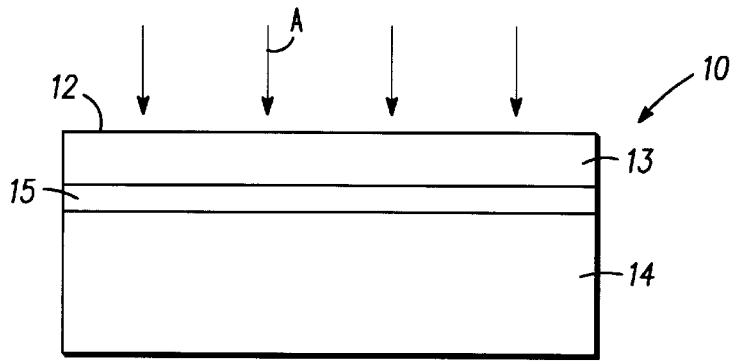
FIG. 1 is a sectional side view of a substrate, illustrating implantation of ions therein.

Turning now to the drawings in which like reference characters indicate corresponding elements throughout the several views, attention is first directed to FIG. 1 which illustrates the first step in the process of the present invention. A substrate 10 having a planar surface 12 is divided into a thin film 13 and a remaining mass 14 as defined by a layer 15 of microbubbles. Layer 15 of microbubbles is created by implantation of ions through planar surface 12 in the direction indicated by arrowed lines A. In this specific example, substrate 10 is silicon carbide and the preferred ion for use in this process is hydrogen that is ion implanted in a flux or dose of at least approximately 5E16 atoms/$cm^2$. It will be understood that other substrates, preferably having a wide bandgap such as gallium nitride, diamond, and other ions can be used. Also, other ions such as helium or combinations of ions can be used.

Figure 2:
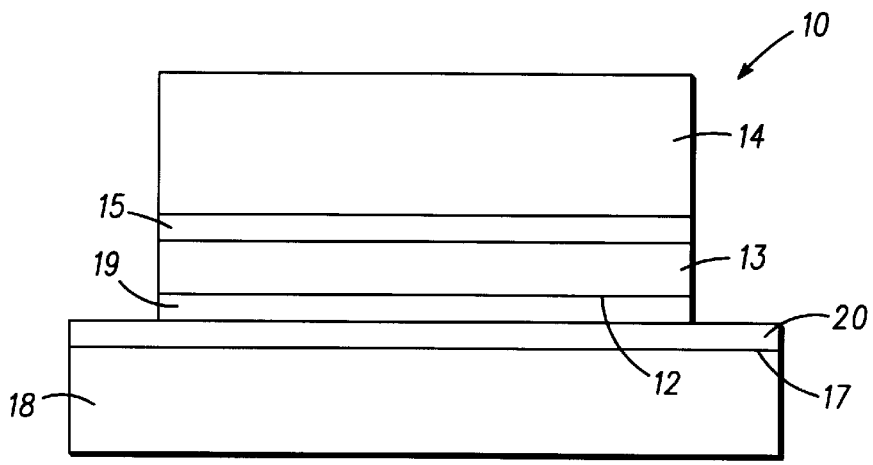
FIG. 2 is a sectional side view illustrating the bonding of the substrate to a support.

Turning now to FIG. 2, planar surface 12 of implanted substrate 10 is intimately contacted with a planar surface 17 of a support 18. The function of support 18 will be discussed in greater detail presently, but briefly, support 18 acts as a rigid support for thin film 13 when it is separated from remaining mass 14 of substrate 10. Preferably, support 18 is a material which is inexpensive and easily thinned. For this reason, support 18 can be an inexpensive silicon wafer. Substrate 10 can be intimately contacted to support 18 by bonding. While there are many techniques for bonding two materials, a preferred method is by forming an oxide layer 19 on planar surface 12 of substrate 10, and an oxide layer 20 on planar surface 17 of support 18. When placed together, oxide layer 19 and oxide layer 20 will readily bond.

Figure 3:
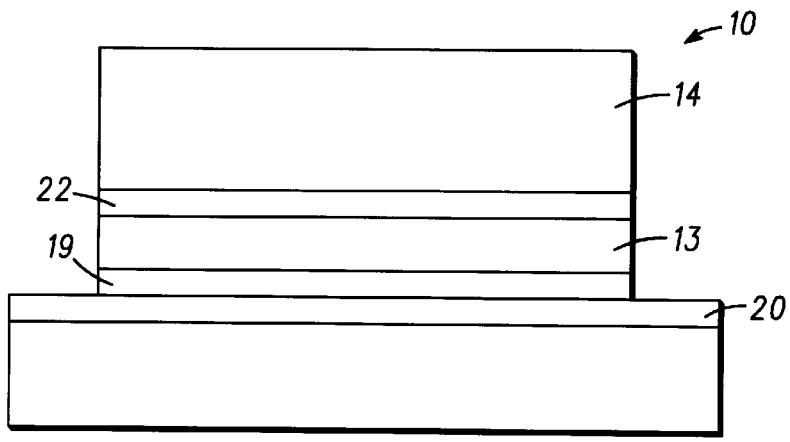
FIG. 3 is a sectional side view illustrating separating the thin film from the main body of the substrate.

Referring now to FIG. 3, thin film 13 is separated from remaining mass 14 by heating substrate 10 and support 18 to a temperature greater than 300 degrees Celsius. Heat treating substrate 10 and support 18 creates by a crystalline rearrangement effect in substrate 10 and a pressure effect in the microbubbles of layer 15, a separation 22. For a more detailed description of the process of implantation of ions to form a layer 15 of microbubbles and separating thin film 13 from remaining mass 14, refer to U.S. Pat. No. 5,374,564, issued to Bruel on Dec. 20, 1994 hereby incorporated by reference. Because remaining mass 14 is substantially undamaged and only a very small portion has been removed as thin film 13, it can be re-used repeatedly for this procedure. Recycling of substrate 10 results in greatly reduced costs.

Figure 4:
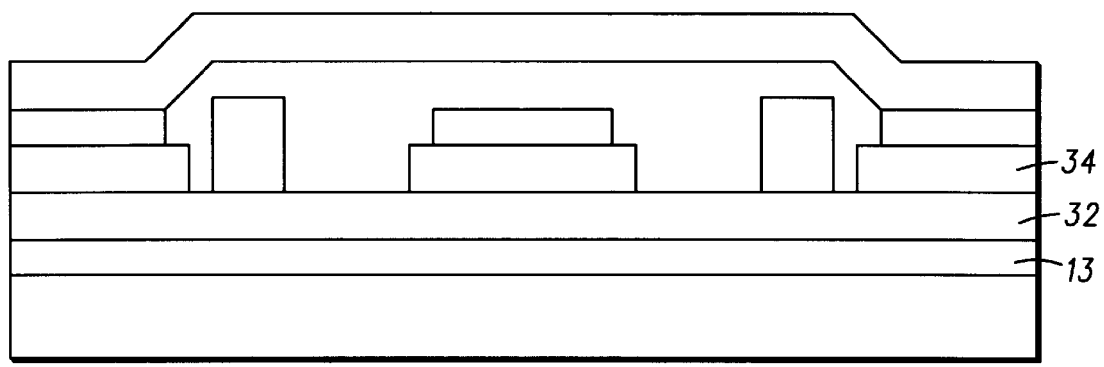
FIG. 4 is a sectional side view illustrating formation of a semiconductor device on the substrate of FIG. 3 and thinning the support.

After separation, a semiconductor device 30 can be formed on thin film 13 as illustrated in FIG. 4. Fabrication of semiconductor device 30 preferably includes epitaxially growing semiconductor layers on thin film 13. In this specific example, a lateral RF transistor is formed by epitaxially growing a channel layer 32 on thin film 13 and epitaxially growing a contact layer 34 on channel layer 32. The field effect transistor can then be formed in the layers as is conventionally known. After formation of the semiconductor device, support 18 is thinned, leaving a thin layer as illustrated or entirely removing support 18. Alternatively, source, channel, and drain regions could be implanted into film 13 using techniques known to those skilled in the art. Additionally, the channel layer can also be implanted instead of growing the channel layer epitaxially. Since support 18 can be a silicon wafer, conventional thinning techniques such as dry or wet chemical etching or backlapping/polishing can be employed. It will be understood that the procedure of the present invention can be used for substantially any wide bandgap power device.

Figure 5:
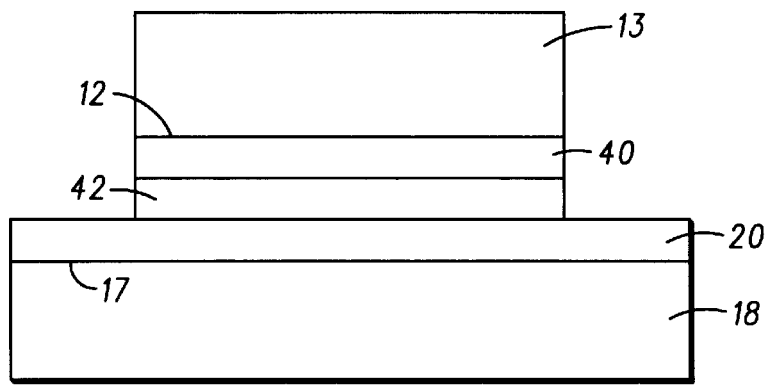
FIG. 5 is a sectional side view illustrating another embodiment of the bonding of the substrate to a support.

A further embodiment of the method of the present invention is illustrated in FIG. 5. The step of intimately contacting planar surface 12 of implanted substrate 10 with a planar surface 17 of support 18 includes forming a thin metal layer 40 on surface 12 of substrate 10. Substrate 10 and support 18 are then intimately contacted such as by bonding as described above. In this example, an oxide layer 42 is formed on metal layer 40 to bond with oxide layer 20 formed on surface 17 of support 18. Separation as described previously is performed leaving thin film 13 bonded to support 18 by metal layer 40 and oxide layers 20 and 42.

Figure 6:
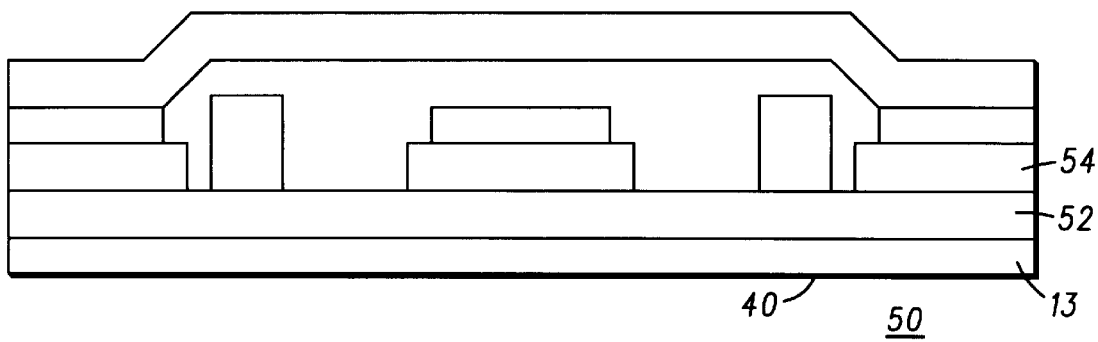
FIG. 6 is a sectional side view illustrating another embodiment of the formation of a semiconductor device on the substrate of FIG. 5 and thinning the support.

After separation, a semiconductor device 50 can be formed on thin film 13 as illustrated in FIG. 6. Fabrication of semiconductor device 50 preferably includes epitaxially growing semiconductor layers on thin film 13. In this specific example, a lateral RF field effect transistor is formed by epitaxially growing a channel layer 52 on thin film 13 and epitaxially growing a contact layer 54 on channel layer 52. The field effect transistor can then be formed in the layers as is conventionally known.

After formation of the semiconductor device, support 18 is removed employing metal layer 40 as an etch stop. Since support 18 can be a silicon wafer, conventional thinning techniques such as dry or wet chemical etching or backlapping/polishing can be employed. Besides providing a convenient etch stop, metal layer 40 provides a back metal to the semiconductor device which can be used as an electrical contact or used for packaging. If layer 40 is employed as a contact, it can be accessed either from the top by etching through the layers, or from the back.

Thus provided is a new and improved method of fabricating a semiconductor device on a thinned substrate which increases thermal conductivity of the semiconductor device. Furthermore, the method of fabricating a semiconductor device on a thinned substrate of the present invention allows recycling of the substrate and does not require conventional thinning of expensive substrates.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a semiconductor device on thinned wide bandgap material including the steps of:
   providing a support having a planar surface;
   providing a semiconductor substrate;
   implanting a layer of ions in the semiconductor substrate to create a layer of microbubbles defining a film having a planar surface and a remaining mass separated by the layer of implanted ions;
   forming a metal layer covering the planar surface of the semiconductor substrate;
   intimately contacting the metal layer of the film to the planar surface of the support;
   heating the support and the semiconductor substrate to separate the remaining mass from the film;
   forming the semiconductor device on the film; and
   thinning the support.

2. A method as claimed in claim 1 wherein the step of thinning the support includes etching the support utilizing the metal layer as an etch stop.

3. A method as claimed in claim 2 further including the step of using the metal layer as an electrical contact.

4. A method as claimed in claim 1 wherein the semiconductor substrate includes one of silicon carbide, diamond, and gallium nitride.

5. A method as claimed in claim 4 wherein the support includes silicon.

6. A method as claimed in claim 1 wherein the step of fabricating the semiconductor device includes epitaxially growing semiconductor layers on film.

7. A method as claimed in claim 6 wherein the step of epitaxially growing the semiconductor layers includes growing a first channel layer and a contact layer on the channel layer and forming a field effect transistor in the layers.

8. A method as claimed in claim 7 wherein the step of forming the field effect transistor includes forming a lateral RF field effect transistor.

9. A method as claimed in claim 1 wherein the support and the semiconductor substrate are both semiconductor wafers.

10. A method of fabricating a semiconductor device on thinned wide bandgap material including the steps of:
    providing a support having a planar surface;
    providing a semiconductor substrate;
    implanting a layer of ions in the semiconductor substrate to create a layer of microbubbles defining a film having a planar surface and a remaining mass separated by the layer of implanted ions;
    intimately contacting the planar surface of the film to the planar surface of the support including forming a metal layer covering the planar surface of the semiconductor substrate and bonding the metal layer to the planar surface of the support;
    heating the support and the semiconductor substrate to separate the remaining mass from the film;
    forming a field effect transistor in the film; and
    thinning the support to improve thermal conductivity.

11. A method as claimed in claim 10 wherein the step of forming the field effect transistor includes epitaxially growing a first channel layer on the film and a contact layer on the channel layer and forming the field effect transistor in the layers.

12. A method as claimed in claim 10 wherein the step of thinning the support includes etching the support utilizing the metal layer as an etch stop.

13. A method as claimed in claim 12 further including the step of using the metal layer as an electrical contact.

14. A method as claimed in claim 10 wherein the semiconductor substrate includes one of silicon carbide, diamond, and gallium nitride.

15. A method as claimed in claim 14 wherein the support includes silicon.

16. A method as claimed in claim 10 wherein the step of forming the field effect transistor includes forming a lateral RF field effect transistor.

* * * * *